United States Patent
Sasaoka et al.

(10) Patent No.: US 8,051,975 B2
(45) Date of Patent: Nov. 8, 2011

(54) WORKPIECE TRANSFER APPARATUS AND ELECTRONIC COMPONENT TRANSFER APPARATUS

(75) Inventors: Yoshikazu Sasaoka, Toyama (JP); Satoru Takeuchi, Echizen (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/276,016

(22) Filed: Nov. 21, 2008

(65) Prior Publication Data

US 2009/0090602 A1    Apr. 9, 2009

Related U.S. Application Data

(63) Continuation of application No. PCT/JP2007/059362, filed on May 2, 2007.

(30) Foreign Application Priority Data

May 24, 2006    (JP) .................................. 2006-144558

(51) Int. Cl.
*B65G 49/00*    (2006.01)
(52) U.S. Cl. ............... 198/803.5; 198/478.1; 198/482.1; 198/493
(58) Field of Classification Search ............. 198/370.01, 198/370.11, 370.12, 436, 438, 440, 441, 198/469.1, 470.1, 471.1, 478.1, 482.1, 493, 198/803.3, 803.5, 803.14, 803.15; 406/51, 406/52, 62, 63, 64, 66, 67, 68; 209/644, 209/573
See application file for complete search history.

(56) References Cited

U.S. PATENT DOCUMENTS

| 3,097,743 | A | * | 7/1963 | Scholten et al. | 209/565 |
| 3,240,332 | A | * | 3/1966 | Grunwald | 209/3.3 |
| 4,009,650 | A | * | 3/1977 | Lascelles et al. | 99/490 |
| 5,152,390 | A | * | 10/1992 | Kubota et al. | 198/463.4 |
| 5,590,791 | A | * | 1/1997 | Gschweitl | 209/577 |
| 5,842,579 | A | * | 12/1998 | Garcia et al. | 209/573 |
| 6,204,464 | B1 | * | 3/2001 | Garcia et al. | 209/574 |

(Continued)

FOREIGN PATENT DOCUMENTS

JP    3-206697    9/1991

(Continued)

OTHER PUBLICATIONS

Office Action issued Sep. 23, 2009 in related U.S. Appl. No. 12/276,107, filed Nov. 21, 2008 by Satoru Takeuchi et al., which contains comments on some of the prior art of record.

(Continued)

*Primary Examiner* — Gene Crawford
*Assistant Examiner* — William R Harp
(74) *Attorney, Agent, or Firm* — Ostrolenk Faber LLP

(57) ABSTRACT

A workpiece conveying apparatus for conveying a workpiece disposed in a through hole in a conveying table allows the workpiece to be reliably dismounted from the through hole using compressed gas, suppresses the workpiece from unintentionally jumping out because of residual pressure of the compressed air, and increases the conveying efficiency. In an electronic-component conveying apparatus, a conveying table is arranged to face a conveying surface of a conveying stage, with an electronic component disposed in a through hole in the conveying table. When the conveying table is rotated, the electronic component is conveyed. The conveying surface has an exhaust hole at a position where the electronic component is to be dismounted. The total area of the opening of the exhaust hole in the conveying table is larger than the area of the surface of the electronic component facing the conveying surface of the conveying stage.

6 Claims, 8 Drawing Sheets

U.S. PATENT DOCUMENTS

| | | | |
|---|---|---|---|
| 6,435,338 B1 * | 8/2002 | Iwamoto | 198/803.5 |
| 6,479,777 B2 | 11/2002 | Yamakawa | |
| 6,540,065 B2 * | 4/2003 | Kurabe et al. | 198/471.1 |
| 6,906,508 B1 * | 6/2005 | Saulnier et al. | 324/158.1 |
| 7,119,299 B2 * | 10/2006 | Kojima et al. | 209/573 |
| 2004/0145103 A1 | 7/2004 | Kojima et al. | |

FOREIGN PATENT DOCUMENTS

| | | |
|---|---|---|
| JP | 3206697 | 10/1991 |
| JP | 3110024 | 12/1991 |
| JP | 2000-218458 | 8/2000 |
| JP | 2000218458 | 8/2000 |
| JP | 2004226101 | 12/2004 |
| JP | 2006-27881 | 2/2006 |
| JP | 2006027881 | 2/2006 |

OTHER PUBLICATIONS

Office Action issued Mar. 31, 2010 in related U.S. Appl. No. 12/246,079, filed Oct. 6, 2008 by Yashikazu Sasaoka et al., which includes, at p. 2, a nonstatutory obviousness-type double patenting rejection over certain claims of the present application.

PCT International Search Report issued Jul. 3, 2007, in connection with PCT/JP2007/059362 filed May 2, 2007 in the name of Murata Manufacturing Co., Ltd.

PCT Written Opinion issued Jul. 3, 2007, in connection with PCT/JP2007/059362 filed May 2, 2007 in the name of Murata Manufacturing Co., Ltd.

Taiwanese Office Action and Search Report issued Apr. 12, 2010 in connection with corresponding Taiwanese Application No. 096117444.

Office Action issued Mar. 31, 2010 in related U.S. Appl. No. 12/246,079, which includes, at p. 2, a nonstatutory obviousness-type double patenting rejection over certain claims of the present application.

Chinese Office Action issued Dec. 24, 2010 in connection with corresponding Chinese Patent Application No. 200780014213.8 and English Language translation.

* cited by examiner

WORKPIECE TRANSFER APPARATUS AND ELECTRONIC COMPONENT TRANSFER APPARATUS

CROSS-REFERENCE TO RELATED APPLICATIONS

This is a continuation under 35 U.S.C. §111(a) of PCT/JP2007/059362 filed May 2, 2007, and claims priority of JP2006-144558 filed May 24, 2006, both incorporated by reference.

This application is related to U.S. Ser. No. 12/246,079, filed Oct. 6, 2008, (P/1320-238), also incorporated by reference.

BACKGROUND

1. Technical Field

The present disclosure relates to a workpiece conveying apparatus for conveying multiple workpieces such as chip electronic components. More specifically, the present disclosure relates to a workpiece conveying apparatus and an electronic-component conveying apparatus of the type that conveys workpieces by moving a conveying table, which has through holes serving as container portions for containing workpieces, over a conveying stage.

2. Background Art

Conventionally, in manufacturing chip electronic components, after chip electronic components are fabricated and inspected for their properties, selection of non-defective components and defective components according to their properties is performed. The chip electronic components are also classified into a plurality of groups according to their properties. To automate these operations and increase productivity, various manufacturing apparatuses have been proposed.

For example, Patent Document 1, which will be specified below, discloses an exemplary electronic-component conveying apparatus of this type. In the electronic-component conveying apparatus, a disk-shaped conveying table is arranged such that it contacts a conveying surface of a table base to convey electronic components. The disk-shaped conveying table is connected to a rotary drive source and is capable of rotation about the central axis thereof. The conveying table has a plurality of through holes along the circumference thereof, each of which can contain one of the electronic components successively supplied from a hopper. The hopper supplies electronic components into these through holes. The electronic components are conveyed in the circumferential direction of the conveying table by the conveying table sliding and rotating on the conveying surface of the table base.

In this apparatus, while the electronic components are conveyed in the circumferential direction of the conveying table, the properties of the electronic components are measured. Then, the electronic components having gone through the property measurement are dismounted from the through holes by any suitable means for dismounting the electronic components, which are then subjected to selection of non-defective components and defective components according to the result of the measurement, or classification according to the properties.

The conveying surface has vacuum recesses communicating with the through holes and connected to a vacuum suction source or the like, which serves to maintain positions of the electronic components during the conveyance.

FIG. 10 shows a known structure that is used to dismount the electronic components having gone through the property measurement. That is, as shown in FIG. 10, in an electronic-component conveying apparatus 101, the conveying table 102 has through holes 102a. Each through hole 102a contains an electronic component 104. One surface 102b of the conveying table 102 contacts a conveying surface 103a of a table base 103.

The table base 103 has exhaust holes 103b, which open in the conveying surface 103a at positions where the electronic components 104 are to be dismounted. The exhaust holes 103b extend from the conveying surface 103a to a surface 103c opposite the conveying surface 103a and are connected to a compressed-air supplying hose 105. The compressed-air supplying hose 105 is connected to a compressed-air supplying source, such as a compressor or a cylinder.

When the conveying table 102 is rotated and the electronic components 104 after the measurement are brought to the electronic-component dismounting position, the exhaust holes 103b, which have a smaller diameter than the opening of the through holes 102a, face a part of the through holes 102a. Then, compressed air is jetted through the exhaust holes 103b. The pressure of the compressed air causes the electronic components 104 to move to the outside of the through holes 102a, whereby the electronic components 104 are dismounted.

This method allows the electronic components 104 to be dismounted without receiving mechanical impact, and thus, the electronic components 104 are negligibly damaged.

Patent Document 1: Japanese Unexamined Patent Application Publication No. 2004-226101

As described above, the conveying table 102 slides and moves on the conveying surface 103a of the table base 103 independently of the table base 103. Therefore, after the electronic components 104 are dismounted by compressed air, the conveying table 102 is further rotated. As a result, the exhaust holes 103b are closed by the one surface 102b of the conveying table 102 again.

In this case, there will be no problems if the compressed air is completely discharged into the through hole 102a to cause the electronic components 104 to be dismounted, and the exhaust holes 103b are then closed by the one surface 102b of the conveying table 102 after supply of compressed air is stopped.

However, with an increased conveying speed, the openings of the exhaust holes 103b are sometimes closed by the conveying table 102 while compressed air remains in the exhaust holes 103b. In such cases, compressed air remains in the exhaust holes 103b and generates residual pressure.

Thus, when the conveying table 102 is further rotated and subsequent through holes containing electronic components not to be dismounted at the electronic-component dismounting position are brought to positions above the exhaust holes 103b, the electronic components not to be dismounted are sometimes dismounted because of the residual pressure. Thus, in the conventional electronic-component conveying apparatus, the conveying table 102 is not rotated or moved immediately after the electronic components 104 are dismounted, and the conveying table 102 needs to wait for a predetermined time so that the air is completely discharged. That is, a waiting time to release residual pressure is required, which prevents the electronic-component conveying apparatus from operating at a high speed.

In particular, as the size of the electronic components becomes small, the size of the exhaust holes 103b also needs to be small. If the size of the exhaust holes 103b is small, the amount of air jetted therethrough becomes insufficient. Therefore, the length of the waiting time to remove residual pressure needs to be further increased. There is a problem in that, however, even if the length of the waiting time is increased, residual pressure cannot be sufficiently released.

SUMMARY

In view of the foregoing problems, the disclosed workpiece conveying apparatus and electronic-component conveying apparatus solve the drawbacks associated with the above-described conventional art, wherein the workpiece conveying apparatus has a structure in which a high-pressure gas is jetted through an exhaust hole into a through hole containing a workpiece to dismount the workpiece from the through hole. The workpiece conveying apparatus can solve the above-described problem associated with residual pressure, prevent a workpiece from unintentionally jumping out, and accelerate the conveying process including a process of dismounting a workpiece.

As described herein, a workpiece conveying apparatus advantageously includes: a conveying stage having a conveying surface for conveying a workpiece; a conveying table having a first surface arranged to face the conveying surface of the conveying stage and a second surface opposite the first surface, the conveying table having a through hole extending from the first surface to the second surface; and receiving a driving force from a driving unit for enabling the conveying table to slide and move relative to the conveying surface while the first surface of the conveying table faces the conveying surface of the conveying stage, the driving unit being connected to the conveying table and/or the conveying stage. The workpiece conveying apparatus conveys the workpiece by moving the conveying table relative to the conveying surface while the workpiece is disposed in the through hole in the conveying table. The conveying surface of the conveying stage has an exhaust hole through which compressed gas is jetted to dismount the workpiece disposed in the through hole, the exhaust hole being located at a workpiece dismounting position where the exhaust hole is alignable with the through hole. The workpiece conveying apparatus further employs a compressed-gas supplying unit connected to the exhaust hole. A total area of an opening of the exhaust hole proximate to the conveying table is larger than or equal to an area of an end surface of the workpiece facing the conveying surface of the conveying stage.

In the workpiece conveying apparatus, the conveying surface of the conveying stage preferably has a vacuum recess connected to the through hole, the first surface of the conveying table preferably has a vacuum groove communicating with the through hole and the vacuum recess, and the workpiece conveying apparatus preferably further is used with a vacuum unit connected to the vacuum recess. In this case, a vacuum of the vacuum unit enables the workpiece to be retained in a proper position while the workpiece is conveyed.

The exhaust hole preferably has a main exhaust-hole section and a nozzle section narrower than the main exhaust-hole section and connecting the main exhaust-hole section and the opening of the exhaust hole. A length of a compressed-gas flow path at the nozzle section is preferably less than or equal to 60 percent of a square root of the area of an opening of the through hole proximate to the conveying surface.

With these features, the fluid resistance can be decreased when the compressed gas is jetted, whereby the flow rate of the compressed gas can be increased. This enables the workpiece to be reliably dismounted from the through hole. Further, the operation time from the beginning to the end of jetting of compressed gas can be decreased. Accordingly, the operation speed of the workpiece conveying apparatus can be increased.

The opening of the exhaust hole is preferably in the shape of an elongated hole whose longitudinal direction corresponds to a direction in which the workpiece is conveyed. In this case, even when the through hole for containing the workpiece is misaligned with the exhaust hole in the conveying direction to some extent, residual pressure can be reliably released. That is, residual pressure can be released even with a low positioning accuracy of the through hole in the conveying direction.

If the exhaust hole has a plurality of the nozzle sections, the workpiece will be placed on the portion between the plurality of nozzle sections. Thus, the workpiece is less likely to interfere with the peripheries of the openings of the nozzle sections. If the plurality of nozzle sections include first and second nozzle sections and the first and second nozzle sections are arranged such that a part of the workpiece is positioned on a portion between the first and second nozzle sections, the workpiece moves on the portion between the first and second nozzle sections. Thus, the workpiece is less likely to interfere with the peripheries of the openings of the first and second nozzle sections.

The conveying table preferably is disk-shaped having a central axis. The driving unit drives and rotates the conveying table about the central axis. In this case, the workpiece disposed in the through hole is conveyed in the circumferential direction of the conveying table with the rotation of the conveying table. Because the conveying path extends in the circumferential direction of the disk-shaped conveying table, the workpiece conveying apparatus can be made compact, and the installation space thereof can be reduced.

Although the workpiece conveyed by the workpiece conveying apparatus is not particularly limited, it is contemplated that an electronic component will be conveyed as the workpiece. The workpiece conveying apparatus is particularly suited for conveying a small electronic component, such as a chip electronic component whose external dimensions are small.

The workpiece conveying apparatus conveys the workpiece by moving the conveying table, which is arranged to face the conveying surface of the conveying stage and has the through hole containing the workpiece, relative to the conveying surface. However, the conveying stage, or both the conveying table and the conveying stage, may be moved.

The conveying stage has the exhaust hole at the workpiece dismounting position where the exhaust hole is alignable with the through hole. Therefore, by jetting compressed gas from the compressed-gas supplying unit connected to the exhaust hole, the workpiece can be promptly dismounted from the through hole at the workpiece dismounting position by the pressure of compressed air. Further, because the total area of the opening of the exhaust hole proximate to the conveying table is set to be larger than the area of the surface of the workpiece facing the conveying surface of the conveying stage, compressed air is promptly jetted through the exhaust hole at a high speed.

Thus, residual pressure is less likely to be generated when the conveying table is rotated and closes the exhaust hole. Thus, the subsequent workpiece can be prevented from undesirably jumping out because of residual pressure, and the conveying speed of the workpiece conveying apparatus can be increased. Accordingly, the efficiency of producing workpieces can be increased.

Other features and advantages will become apparent from the following description of embodiments, which refers to the accompanying drawings.

DETAILED DESCRIPTION

Reference Numerals

Figure 1:
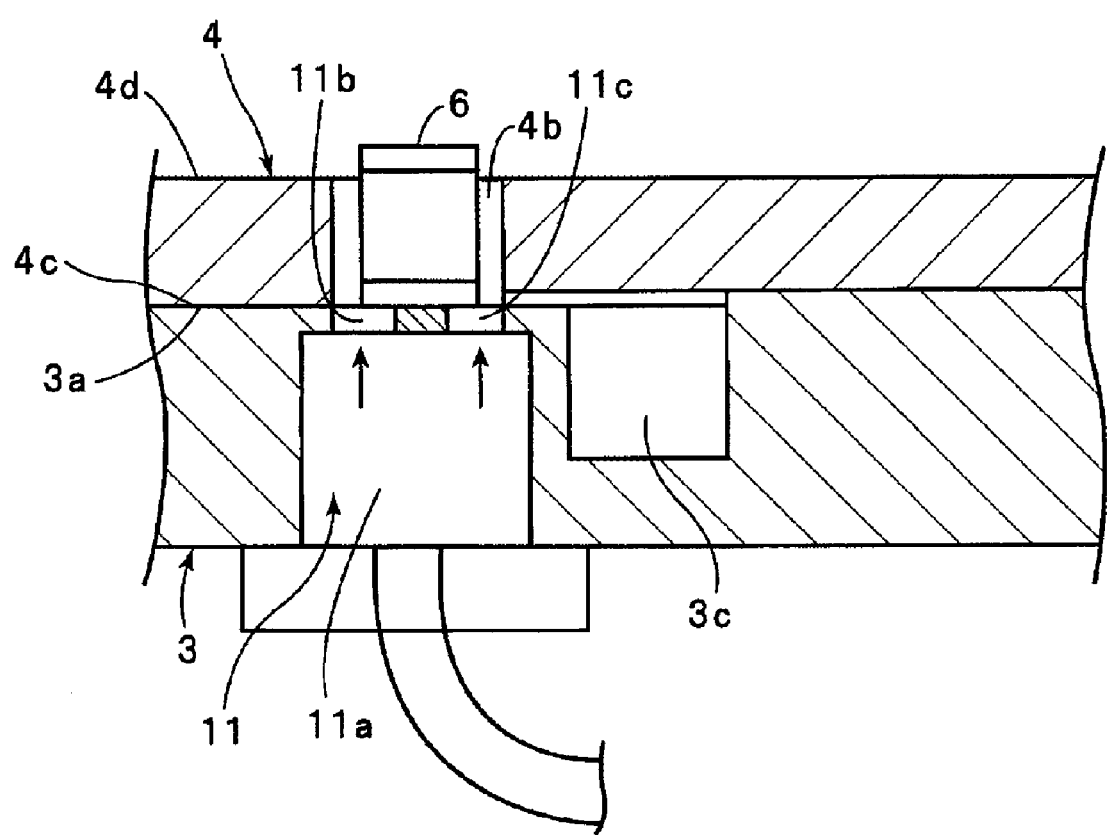
FIG. 1 is a partially cutaway enlarged side sectional view of an electronic-component conveying apparatus, showing a portion where an electronic component is to be dismounted by compressed gas.

1: electronic-component conveying apparatus
2: base plate
3: conveying stage
3a: conveying surface
3b, 3c: vacuum recess
4: conveying table
4a: central axis
4b: through hole
4c: first surface
4d: second surface
4e: vacuum groove
5: driving unit
6: electronic component
7: electronic-component supplying unit
8: property measuring device
9: dismounting unit
10: vacuum source
11: exhaust hole
11a: main exhaust-hole section
11b, 11c: nozzle section
11d: retaining section
24b, 34b, 44b: through hole Now, the present disclosure will be clarified by explaining specific embodiments with reference to the drawings.

Figure 2A:
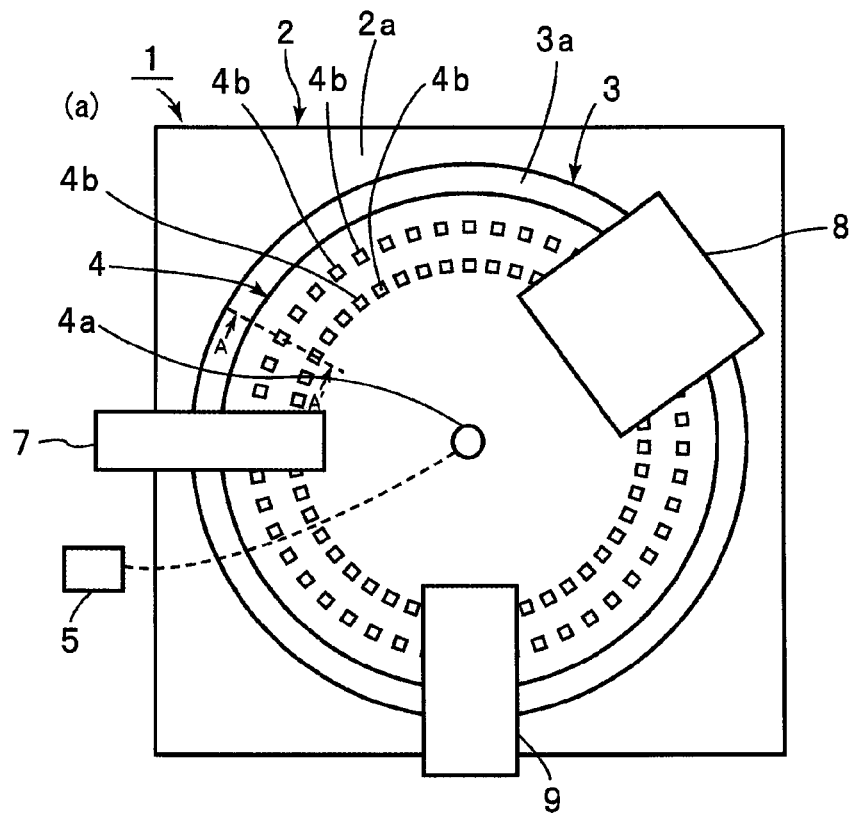
FIG. 2(a) is a front view of an electronic-component conveying apparatus according to an embodiment.

FIGS. 2(a) and (b) are, respectively, a schematic front view of an electronic-component conveying apparatus according to an embodiment, and a schematic front view of the same excluding a conveying table, which will be described below.

An electronic-component conveying apparatus 1 has a base plate 2. In the present embodiment, the base plate 2 is installed vertically in an installation space such that it extends in the top-bottom direction. Alternatively, the base plate 2 may be installed such that it extends obliquely to the top-bottom direction, or the base plate 2 may be installed such that it extends horizontally.

A conveying stage 3 is arranged on one surface 2a of the base plate 2. Although the conveying stage 3 is a disk-shaped plate in the present embodiment, it may have another shape, such as a polygonal shape. The conveying stage 3 is fixed to the base plate 2. The convey plate 3 has a conveying surface 3a opposite the surface fixed to the base plate 2.

A conveying table 4 is arranged on the conveying surface 3a. The conveying table 4 is disk-shaped. The conveying table 4 is arranged such that it can rotate about a central axis 4a, which is connected to a driving unit 5 shown schematically. The driving unit 5 rotates and moves the conveying table 4 in the clockwise direction.

Although the conveying table 4 is rotated about the central axis 4a in the clockwise direction in the present embodiment, it is also possible that the conveying table 4 is fixed and the conveying stage 3 is rotated about the central axis. It is also possible that both the conveying stage 3 and the conveying table 4 are rotated about the central axis 4a at different speeds or in opposite directions.

That is, it is only necessary that the conveying table 4 be moved relative to the conveying surface 3a of the conveying stage 3.

The conveying table 4 is formed of a hard material, such as metal or synthetic resin, for example. The conveying table 4 has a plurality of through holes 4b arranged in the circumferential direction near the periphery thereof. The through holes 4b constitute container portions for containing electronic components as workpieces. The plurality of through holes 4b are arranged in two arrays in the circumferential direction.

However, the number of arrays in which the plurality of through holes 4b are arranged is not specifically limited, and the plurality of through holes 4b may be arranged in a single array, or three or more arrays.

Figure 2B:
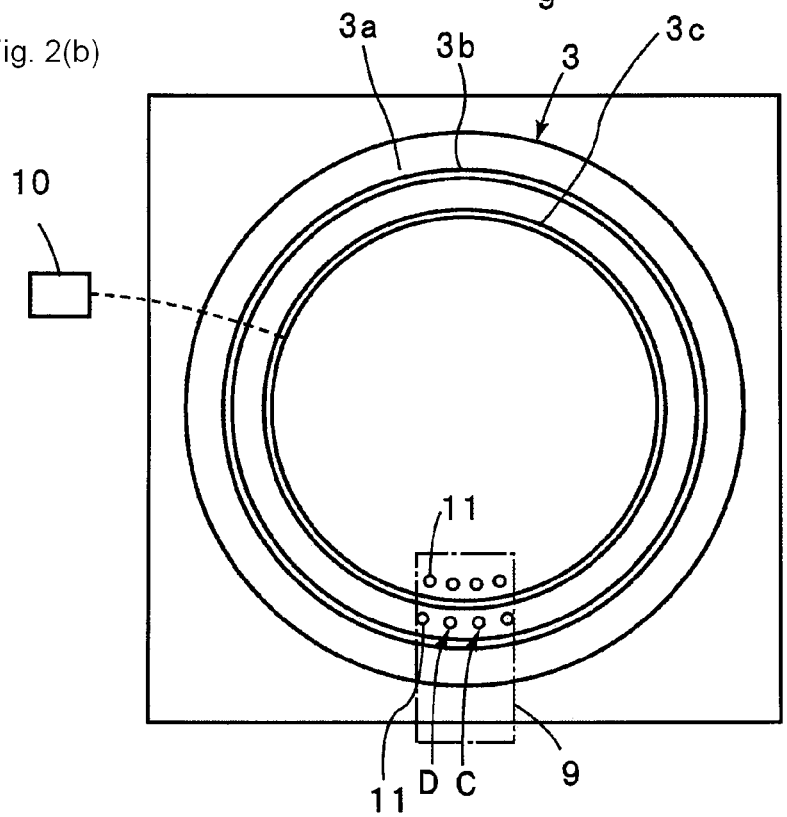
FIG. 2(b) is a front view for explaining vacuum grooves formed in a conveying surface.
Figure 3:
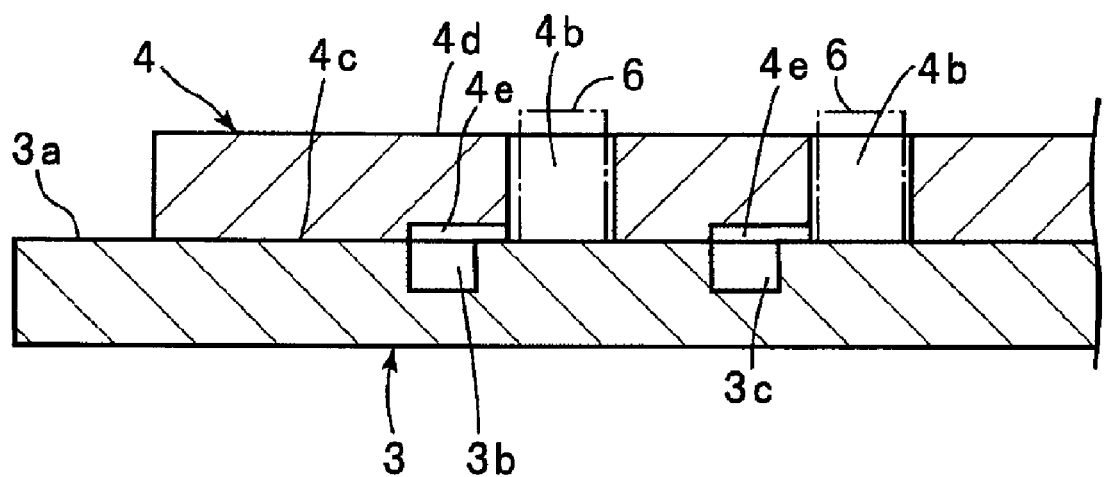
FIG. 3 is an enlarged side sectional view showing the section taken along line A-A' in FIG. 2.

FIG. 3 is a partially cutaway sectional view of the section taken along line A-A' in FIG. 2. As is clear from FIG. 3, the conveying table 4 has a first surface 4c, which is in contact with or adjacent to the conveying surface 3a of the conveying stage 3, and a second surface 4d, which is the surface opposite the first surface 4c. The through holes 4b extend from the first surface 4c to the second surface 4d. The opening of each through hole 4b in the second surface 4d is set to be large enough to receive an electronic component 6.

In the present embodiment, the opening of each through hole 4b in the second surface 4d is rectangular.

Referring back to FIG. 2(a), an electronic-component supplying unit 7 inserts the electronic components into the through holes 4b from the second surface 4d side of the conveying table 4. A hopper or any suitable electronic-component supplying unit may be used as the electronic-component supplying unit 7, and there is no specific limitation on the means to be used.

When the conveying table 4 is rotated in the clockwise direction, the conveying table 4 moves while the first surface 4c of the conveying table 4 slides on the conveying surface 3a of the conveying stage 3. As a result, the electronic components 6 disposed in the through holes 4b are conveyed in the circumferential direction of the conveying table 4. A property measuring device 8 is arranged on the path along which the electronic components 6 are conveyed. The property measuring device 8 has, for example, a plurality of probes to be brought into contact with the electrodes of the electronic components, and measures the electrical properties of the electronic components 6. The conveyed electronic components are distinguished into non-defective components and defective components according to the result of the measurement, or classified into groups according to their properties.

Depending on the property to be measured, various electrical measuring devices may be used as the measuring device 8.

As shown in FIG. 2(b), in which the conveying table 4 is removed to expose the conveying surface 3a of the conveying stage 3, the conveying surface 3a has two concentric vacuum recesses 3b, 3c. These vacuum recesses 3b, 3c communicate with a part of each through hole 4b in the conveying table 4 arranged on the conveying stage 3 through vacuum grooves, which will be described below. Since the plurality of through holes are arranged in two arrays in the circumferential direction, the two concentric vacuum recesses 3b, 3c are provided. The vacuum recess 3b is located radially outside of the array having a larger diameter, and the vacuum recess 3c is located radially outside of the array having a smaller diameter, of the two arrays of the plurality of the through holes 4b. The vacuum recess 3c is connected to the through holes 4b constituting the outer array through the vacuum groove, which will be described below, and the inner vacuum recess 3b is connected to the through holes 4b constituting the inner array through the vacuum groove, which will be described below. As shown in FIG. 2(b), the vacuum recesses 3b, 3c are connected to a vacuum source 10, such as a vacuum suction source.

As shown in FIG. 3, the through holes 4b communicate with vacuum grooves 4e, which extend radially with respect to the conveying table 4, at the first surface 4c. Each vacuum groove 4e is provided at the position where a part of the vacuum groove 4e overlaps the vacuum recess 3b or the vacuum recess 3c.

When the vacuum source 10 applies vacuum to the vacuum recesses 3b, 3c, a negative pressure is created therein, whereby the electronic components are retained in position in the through holes 4b.

As shown in FIG. 2(b), the electronic-component dismounting unit 9 has a plurality of exhaust holes 11, which open in the conveying surface 3a.

Figure 4A:
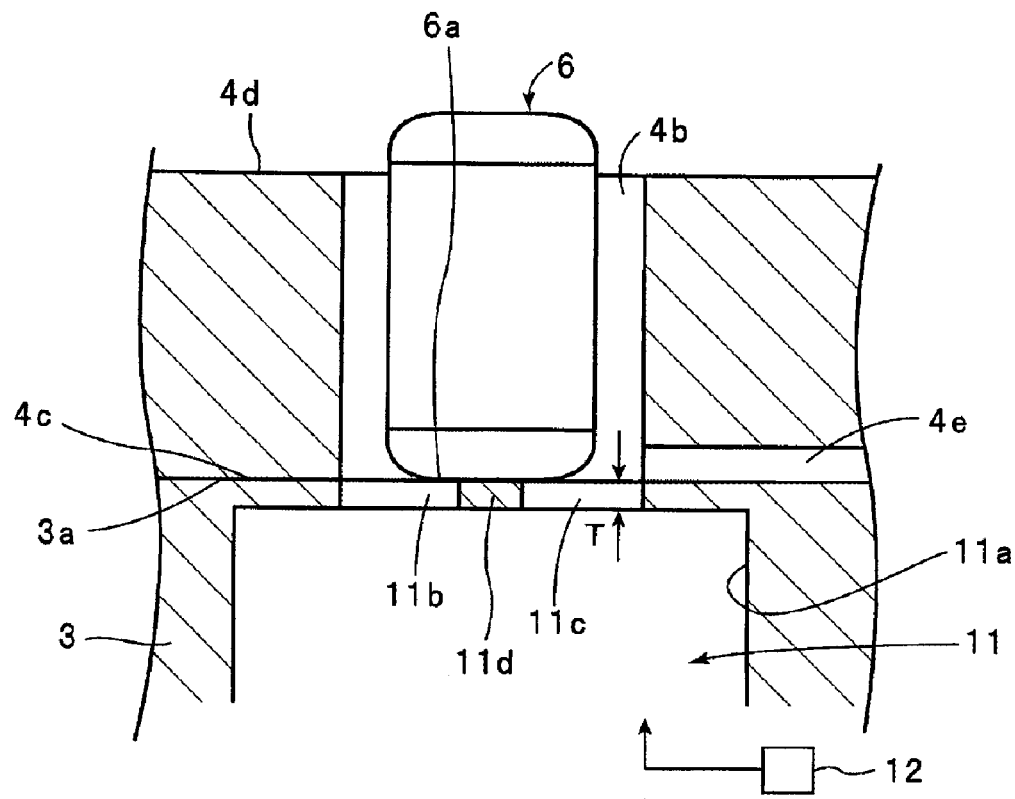
FIG. 4(a) is a partially cutaway enlarged side sectional view for explaining the shape of an exhaust hole formed at a portion where an electronic component is to be dismounted, according to an embodiment.
Figure 4B:
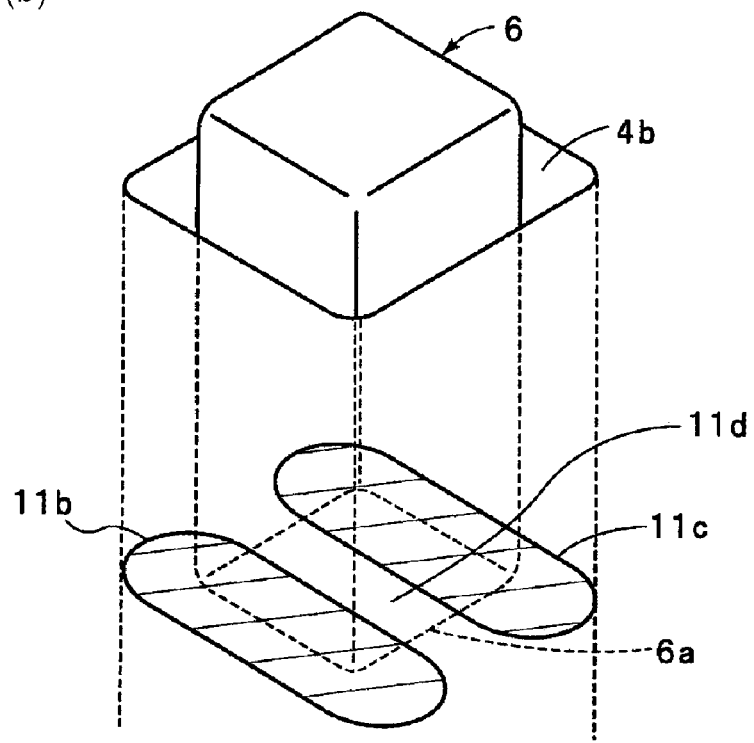
FIG. 4(b) is a schematic perspective view showing the relationship between the through hole and first and second nozzle holes.

FIG. 4(a) is a partially cutaway enlarged sectional view of a portion provided with one of the exhaust holes 11, and FIG. 4(b) is a schematic perspective view of the same.

As shown in FIG. 4(a), the conveying stage 3 has the exhaust holes 11, which open in the conveying surface 3a. In the electronic-component conveying apparatus 1, as described above, the exhaust holes 11 are provided at the position where the electronic components 6 are to be dismounted.

In the present embodiment, each exhaust hole 11 has a main exhaust-hole section 11a, and first and second nozzle sections 11b, 11c, which open in the conveying surface 3a. The main exhaust-hole section 11a is connected to the above-described compressed-air supplying source. The nozzle sections 11b, 11c have a smaller transverse section than the main exhaust-hole section 11a. Herein, a "transverse section" refers to a cross-section perpendicular to the direction in which compressed air passes. The area of the openings of the nozzle sections 11b, 11c in the direction along the transverse section, i.e., the total area of the openings of the nozzle sections 11b, 11c, is set to be larger than the area of a surface 6a of each electronic component 6 facing the conveying surface 3a. In other words, the first and second nozzle sections 11b, 11c are formed such that the total area of the openings thereof is larger than the area occupied by the electronic component 6 in each through hole 4b at the opening proximate to the conveying surface 3a.

As shown in FIGS. 4(a), (b), a retaining section 11d is provided between the first nozzle section 11b and the second nozzle section 11c. Each electronic component 6 is placed on the retaining section 11d, whereby the electronic component 6 is prevented from falling down. Because the retaining sections 11d are provided, the electronic components 6 are less likely to interfere with the peripheries of the openings of the nozzle sections 11b, 11c.

If the retaining sections 11d are not provided, the electronic components 6 may interfere with the peripheries of the openings of the nozzle sections 11b, 11c when they arrive at the electronic-component dismounting position and may hinder the conveying table 4 from moving.

However, because the electronic components 6 are stably placed on the retaining sections 11d and slide, the electronic components 6 are less likely to interfere with the peripheries of the openings of the nozzle sections 11b, 11c.

Because each electronic component 6 is rounded at the corners of portions where external electrodes are formed, as shown, the electrodes are less likely to be damaged when it passes over the retaining section 11d.

As shown in FIG. 4(b), the peripheries of the openings of the nozzle sections 11b, 11c are in the shape of an elongated hole. The longitudinal direction of the elongated holes substantially corresponds to the direction in which the electronic components 6 are conveyed. That is, because the electronic components 6 are conveyed in the circumferential direction of the conveying table 4, the longitudinal direction of the elongated holes substantially corresponds to the circumferential direction of the conveying table 4.

As described above, because the longitudinal direction of the elongated holes is selected such that it substantially corresponds to the direction in which the electronic components 6 are conveyed, the through holes 4b can be reliably positioned above the exhaust holes 11 at the electronic-component dismounting position, even when the through holes 4b are slightly is misaligned with the exhaust holes 11 in the conveying direction. Accordingly, in the electronic-component conveying apparatus 1, the positioning accuracy of the through holes 4b while the conveying table 4 is rotated may be low. Even in that case, the electronic components 6 can be reliably dismounted from the through holes 4b.

In the electronic-component conveying apparatus 1 according to the present embodiment, a compressed-air supplying unit 12 is connected to the exhaust holes 11 and jets compressed air, as a compressed gas, to the through holes 4b through the first and second nozzle sections 11b, 11c of the exhaust holes 11. This allows the electronic components 6 to be easily dismounted from the through holes 4b. In this case, because the total area of the openings of the first and second nozzle sections 11b, 11c is set as described above, compressed air is promptly jetted in the through holes 4b.

Figure 9:
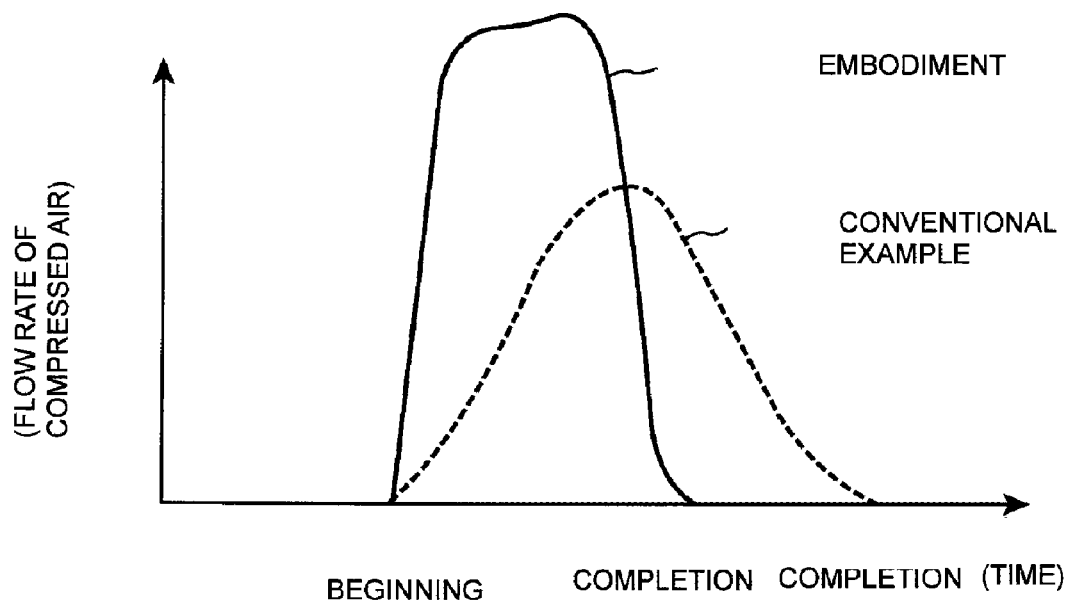
FIG. 9 shows a temporal change in flow path of compressed air jetted through the exhaust hole, in the case of the conventional art and the embodiment.
Figure 10:
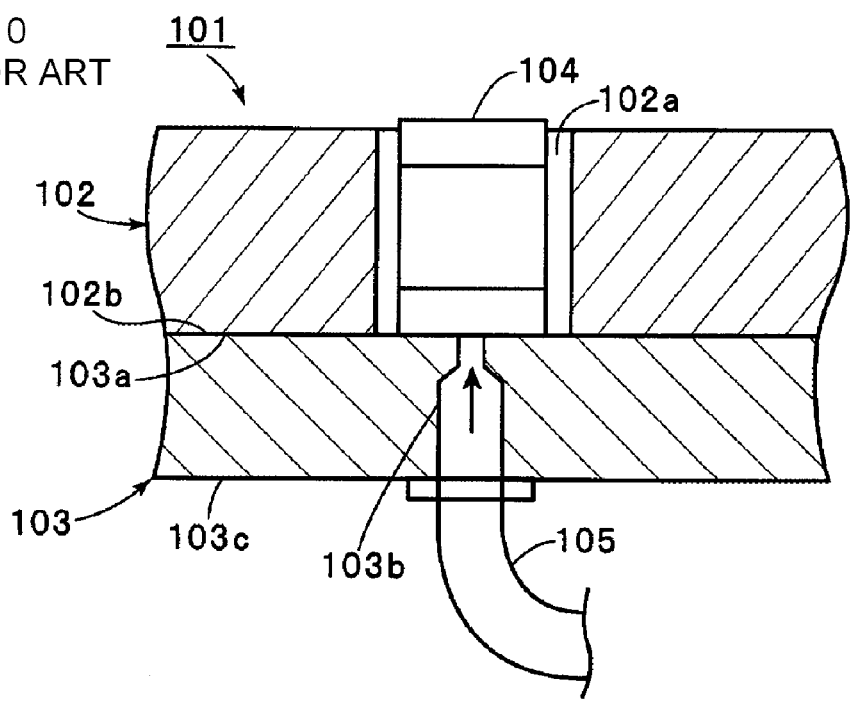
FIG. 10 is a schematic front sectional view for explaining a portion where an electronic component is to be dismounted, according to the conventional electronic-component conveying apparatus.

In the present embodiment, when compressed air is jetted through the first and second nozzle sections 11b, 11c, the compressed air flows with a large flow path from the beginning because the total area of the openings of the first and second nozzle sections is relatively large, as shown in FIG. 9. This enables the necessary amount of compressed air to be jetted completely within a short time. In contrast, because the area of the opening of each exhaust hole is relatively small in the conventional electronic-component conveying apparatus, the length of time from the beginning of jetting to the completion of jetting is long when the same amount of compressed air is jetted, as shown in FIG. 9.

Accordingly, the electronic components 6 can be promptly dismounted.

In addition, after the electronic components 6 are dismounted, and the conveying table 4 is driven and rotated and the first surface 4c of the conveying table 4 covers the first and second nozzle sections 11b, 11c, residual pressure is less likely to be generated. That is, because compressed air is less likely to remain in the exhaust holes 11, residual pressure is less likely to be generated. Accordingly, the electronic components 6 do not unintentionally jump out because of residual pressure, when the subsequent through holes 4 are moved above the exhaust holes 11.

Further, because residual pressure is less likely to be generated, the electronic components 6 can be conveyed with an increased conveying speed of the conveying table 4, i.e., with reduced, or in some cases, no waiting time, which the above-described prior art required. Accordingly, the conveying speed and the conveying efficiency of the electronic components 6 can be increased, whereby the efficiency of producing the electronic components 6 can be improved.

It is preferable that the length T of the compressed-gas jet flow path (refer to FIG. 4), which represents the distance between the outer surface having the openings of the first and second nozzle sections 11b, 11c and the main exhaust-hole section 11a communicating with the first and second nozzle sections 11b, 11c, be less than or equal to 60 percent of the square root of the area of the opening of the through holes 4b. Because the proportion is set to be less than or equal to 60 percent, compressed air can be jetted into the through holes 4b more promptly, and residual pressure is further prevented from generating. Further, the conveying efficiency of the electronic components 6 can be increased.

Although the first and second nozzle sections 11b, 11c are provided in the present embodiment, three or more nozzle sections may be provided depending on the shape of the electronic components.

The openings of the nozzle sections do not necessarily have to be in the shape of an elongated hole, and they may be in the shape of a square, a circle, etc. However, it is preferable that the openings be shaped such that the longitudinal direction thereof substantially corresponds to the conveying direction, as described above.

Next, a process of supplying, conveying, and dismounting the electronic components with the electronic-component conveying apparatus 1 will be described.

As shown in FIG. 2, to classify the electronic components according to their properties and convey them by the electronic-component conveying apparatus 1, the electronic-component supplying unit 7 inserts the electronic components into the through holes 4b in the conveying table 4 on a one-by-one basis. Then, the conveying table 4 is rotated in the clockwise direction by driving the driving unit 5. As a result, the electronic components 6 disposed in the through holes 4b and arranged in the circumferential direction of the conveying table 4 are conveyed in the clockwise direction. At this time, vacuum is applied to the vacuum recesses 3b, 3c whereby the electronic components 6 are retained in position in the through holes 4b while being conveyed.

Then, the property measuring device 8 measures the properties of the conveyed electronic components 6, and classification of the electronic components according to their properties is performed. That is, when the electronic-component dismounting unit 9 dismounts the electronic components, determination to dismount only non-defective components at a certain position and defective components at another position, or to dismount the electronic components at a plurality of positions according to their property values, is performed. Thus, the electronic-component dismounting unit 9 dismounts the electronic components at a specific electronic-component dismounting position, according to the result of the property measurement. Such control may be performed by connecting control means to the electronic-component conveying apparatus 1, and driving the electronic component unit 9 according to the measurement result obtained by the property measuring device 8.

As described above, the electronic-component dismounting unit 9 dismounts the electronic components 6 disposed in the through holes 4b. At this time, compressed air is jetted through the first and second nozzle sections 11b, 11c of the exhaust holes 11 to dismount the electronic components 6. That is, for example, when an electronic component of a first group is to be dismounted at the position C shown in FIG. 2(b), compressed air is jetted through the exhaust hole 11 located at the position indicated by the arrow C to dismount the electronic component. When an electronic component of a second group is to be dismounted at the exhaust hole 11 located at the position D shown in FIG. 2(b), compressed air is jetted through the exhaust hole 11 when the electronic component of the second group arrives at the exhaust hole 11 located at the position indicated by the arrow D to dismount the electronic component.

Because residual pressure is less likely to be generated in the exhaust hole 11 shown by the arrow C when the electronic component of the second group is moved thereto along the conveying path, there is no possibility of the electronic component of the second group unintentionally jumping out from the through hole 4b because of residual pressure. Further, the conveying efficiency of the conveying table 4 can be increased as described above, because residual pressure is less likely to be generated.

Now, specific first to fourth experimental examples will be described.

In the first experiment example (FIG. 5), the case was evaluated where a chip electronic component having dimensions of 1 mm×0.5 mm×0.5 mm was conveyed. In this case, the chip electronic component was disposed in the through hole 4b such that the longitudinal direction thereof corresponded to the depth direction of the through hole 4b. As shown in the schematic plan view of FIG. 5, the through hole 4b had the outline shown by the solid line, and was substantially square-shaped with rounded corners. The distance X1 between two opposing sides was set to be 0.71 mm, the corners were rounded, and the area of the opening was set to be 0.4955 mm$^2$.

Figure 5:
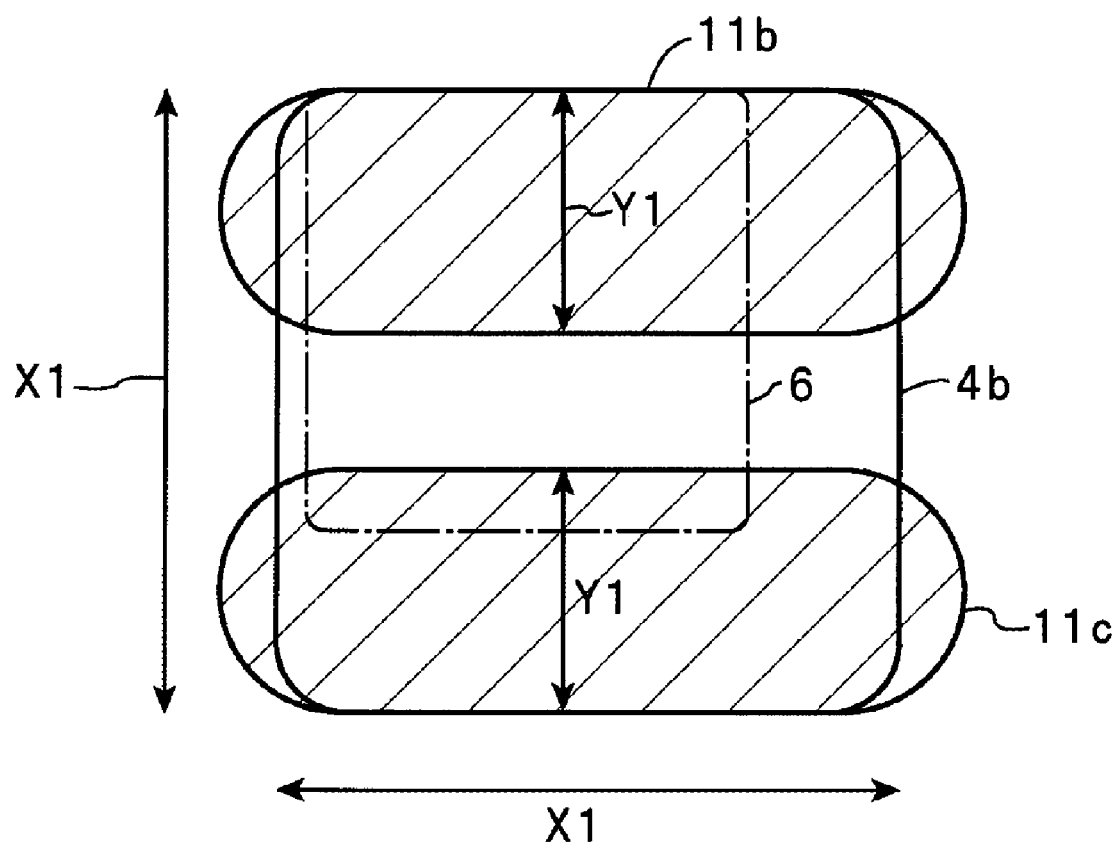
FIG. 5 is a schematic front view showing the relationship among the dimensions of an opening of the through hole, the area of the electronic component facing the conveying surface, and the dimensions of the first and second nozzle holes, according to a first experimental example.

On the other hand, as shown in FIG. 5, the openings of the first and second nozzle sections 11b, 11c were in the shape of an elongated hole, whose dimension in the longitudinal direction was set to be larger than 0.71 mm, and the dimension Y1 in the width direction was set to be 0.28 mm. The total area of the openings of the first and second nozzle sections was set to be 0.3976 mm$^2$. The area occupied by the electronic component 6 in the opening 4b, i.e., the area of the electronic component 6 facing the conveying surface 3a, was 0.5 mm×0.5 mm=0.25 mm$^2$, which was smaller than the total area of the openings of the first and second nozzle sections in the exhaust hole 11. When compressed air under pressure of 150 kPa was jetted under this condition, the time necessary for dismounting the electronic component, from the beginning of jetting to the completion of jetting, could be reduced by about 15 milliseconds, compared to the case where compressed air of the same pressure was jetted through the conventional exhaust hole having a diameter of 0.2 mm.

Figure 6A:
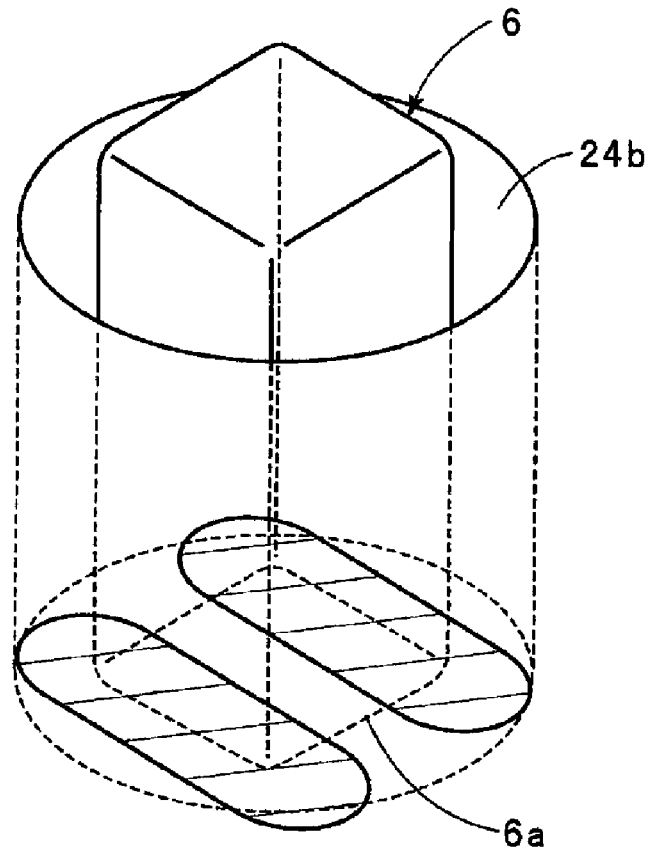
FIG. 6(a) is a schematic perspective view showing the relationship among the shapes of the through hole, the first and second nozzle holes, and the electronic component, according to a second experimental example.
Figure 6B:
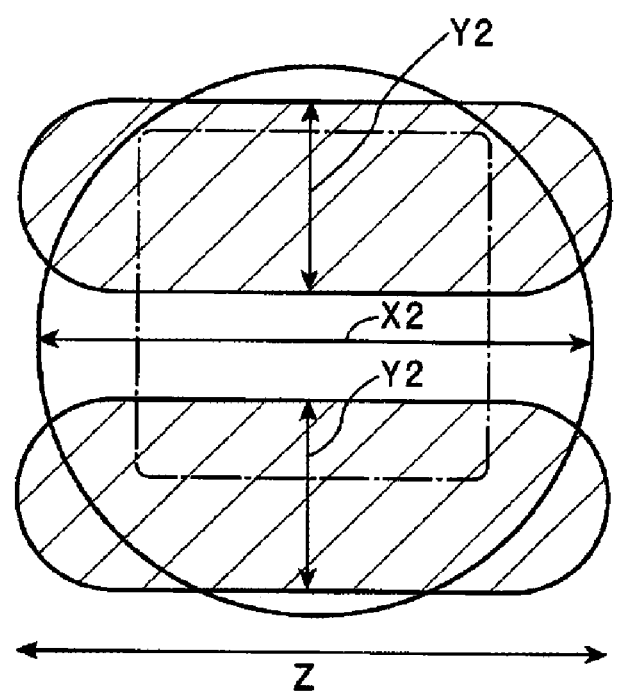
FIG. 6(b) is a schematic front view showing the dimensional relationship among the through hole, the electronic component, and openings of the first and second nozzle sections, prepared in the second experimental example.

FIG. 6(a) is a schematic perspective view for explaining the second experimental example, and FIG. 6(b) is a front view similar to FIG. 5, schematically showing the relationship between the shape of the nozzle holes and the electronic component. In the second experimental example, a through hole 24b had a cylindrical shape. The diameter X2 of the opening of the cylindrical shape was set to be 0.8 mm. Similarly to the first experimental example, the electronic component 6 having dimensions of 1 mm×0.5 mm×0.5 mm was used. As shown in FIG. 6(b), the openings of the first and second nozzle sections 11b, 11c were in the shape of an elongated hole, which is similar to the first experimental example, with the dimension Z in the longitudinal direction being set to be larger than 0.8 mm, and the dimension Y2 in the width direction being set to be 0.28 mm. In this case, the area of the opening of the through hole 24b was $(0.8/2)^2\pi=0.5024$ mm$^2$.

The total area of the openings of the first and second nozzle sections was 0.3808 mm$^2$, and the area of the surface 6a of the electronic component 6 facing the conveying surface 3a was, similarly to the first experimental example, 0.25 mm$^2$. Similarly to the first experimental example, in the case where the conveying table has the circular through hole 24b as in this case, the time from the beginning of jetting to the completion of jetting could be reduced by 15 milliseconds, compared to the case where the conventional electronic-component conveying apparatus having the exhaust hole having a diameter of 0.2 mm was used.

As is clear from the second experiment example, the shape of the opening of the through hole in plan view does not necessarily have to be rectangular, and may be of another shape, e.g., circular.

Figure 7:
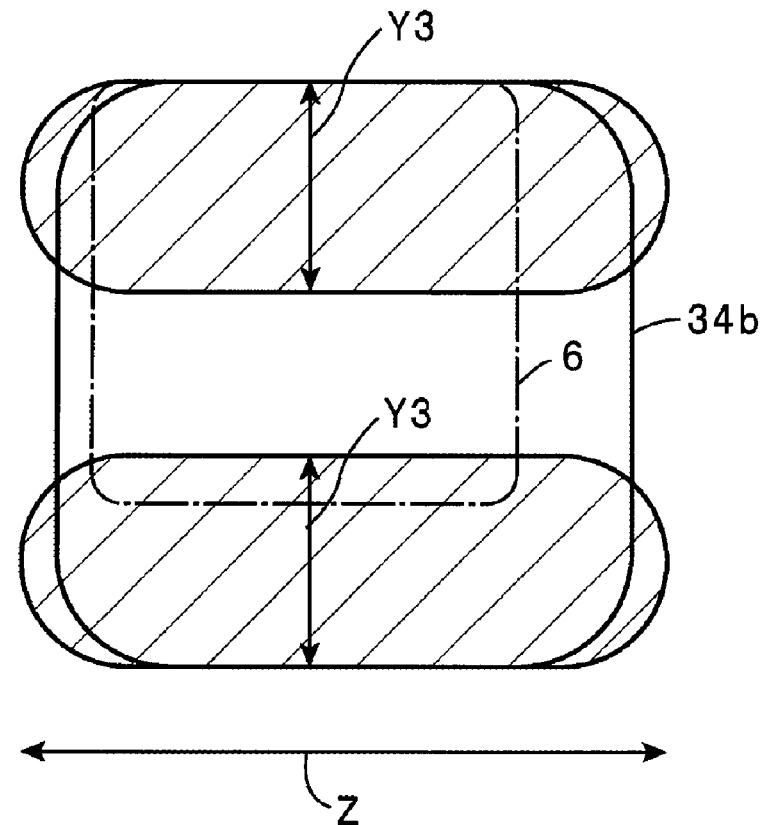
FIG. 7 is a schematic front view showing the relationship among the dimensions of the opening of the through hole, the area of the electronic component facing the conveying surface, and the dimensions of the openings of the first and second nozzle sections according to a third experimental example.

In the third experimental example (FIG. 7), an electronic component having dimensions of 0.6 mm×0.3 mm×0.3 mm was prepared. As shown in FIG. 7, the opening of a through hole 34 was square-shaped with rounded corners, having dimensions of 0.42 mm×0.42 mm. The area of the opening 34b was 0.1678 mm$^2$. The dimension Z in the longitudinal direction of the openings of the first and second nozzle sections 11b, 11c was set to be larger than 0.42 mm, and the dimension Y in the width direction was set to be 0.15 mm. In this case, the total area of the openings, which is the sum of the areas of the openings of the first and second nozzle sections 11b, 11c, was 0.126 mm$^2$. The area of the surface of the electronic component, as a workpiece, facing the conveying surface 3a was 0.3×0.3=0.09 mm$^2$. Also in the third experimental example, when compressed air under pressure of 150 kPa was jetted, the time from the beginning of jetting to the completion of jetting could be reduced by 12 milliseconds, compared to the case where the conventional electronic-component conveying apparatus having a single exhaust hole having a diameter of 0.2 mm was used.

Figure 8:
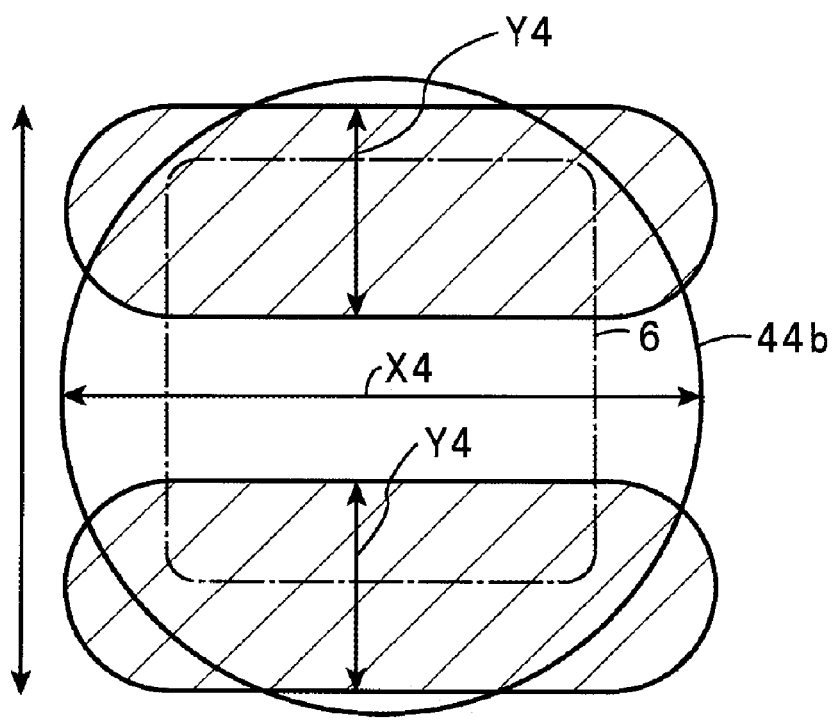
FIG. 8 is a schematic front view showing the relationship among the dimensions of the opening of the through hole, the area of the electronic component facing the conveying surface, and the dimensions of the openings of the first and second nozzle sections according to a fourth experimental example.

FIG. 8 is a front view schematically showing the shapes of the openings of the through hole and the first and second nozzle sections used in the fourth experimental example. In the fourth experimental example, similarly to the third experimental example, an electronic component having dimensions of 0.6×0.3×0.3 mm was used. Similarly to the second experimental example, but not to the third experimental example, a through hole 44b whose opening is circular-shaped was formed in the conveying table 4. The diameter X4 of the through hole 44b was set to be 0.45 mm. With regard to the openings of the first and second nozzle sections 11b, 11c, the dimension in the longitudinal direction was set to be 0.45 mm, and the dimension Y4 in the width direction was set to be 0.15 mm. The area of the opening of the through hole 44b was $(0.45/2)^2\pi=0.1590$ mm$^2$, and the total area of the openings of the first and second nozzle sections was 0.0956 mm$^2$. On the other hand, the area of the surface of the electronic component 6 facing the conveying surface was 0.09 mm$^2$. Similarly to the third experimental example, also in this case, the time from the beginning of jetting to the completion of jetting could be reduced by 12 milliseconds, compared to the conventional apparatus used in the third experimental example.

Although the conveying table is disk-shaped and rotated about the central axis 4a in the clockwise direction in the above-described embodiment, the conveying table does not necessarily have to be disk-shaped. Further, the conveying table may be moved in another direction, for example, it may be moved linearly, so that the conveying path of the through holes provided in the conveying table extends in a direction other than the circumferential direction. That is, the workpiece conveying is not limited to one that rotates a disk-shaped conveying table relative to the conveying surface of the conveying stage.

Although the above-described electronic-component conveying apparatus conveys electronic components as workpieces, it may be used to convey workpieces other than electronic components.

Although compressed air is used as the compressed gas in the above-described embodiment, another inert gas, such as nitrogen gas, may be used.

Although particular embodiments have been described, many other variations and modifications and other uses will become apparent to those skilled in the art. Therefore, the present invention is not limited by the specific disclosure herein.

What is claimed is:

1. A workpiece conveying apparatus comprising:
    a conveying stage having a conveying surface for conveying a workpiece;
    a conveying table having a first surface arranged to face the conveying surface of the conveying stage and a second surface opposite the first surface, the conveying table having a through hole extending from the first surface to the second surface;
    first means for enabling the conveying table to slide and move relative to the conveying surface while the first surface of the conveying table faces the conveying surface of the conveying stage, said first means being connected to at least one of the conveying table and the conveying stage,
    wherein the workpiece conveying apparatus conveys the workpiece by moving the conveying table relative to the conveying surface while the workpiece is disposed in the through hole in the conveying table, wherein the conveying surface of the conveying stage has an exhaust hole through which compressed gas is jetted to dismount the workpiece disposed in the through hole, the exhaust hole being located at a workpiece dismounting position where the exhaust hole is alignable with the through hole, wherein the exhaust hole has an opening in the shape of a plurality of elongated nozzle sections whose longitudinal direction corresponds to a direction in which the workpiece is conveyed; and second means for receiving compressed gas from a compressed-gas supplying source, said second means comprising a hose connected to the exhaust hole, wherein said plurality of nozzle sections of the exhaust hole proximate to the conveying table have a predetermined total area that is larger than or equal to a predetermined end surface area of the workpiece facing the conveying surface of the conveying stage and said plurality of nozzle sections in each said exhaust hole are disposed so that said workpiece, having said end surface area, bridges between all of said plurality of nozzle sections in said exhaust hole, so that the compressed gas is jetted through all of the plurality of the nozzle sections to dismount the workpiece; and wherein elongated retaining sections are disposed between said elongated nozzle sections, and a longitudinal direction of the retaining sections defined between the nozzle sections extends in the direction in which the electronic component is conveyed.

2. The workpiece conveying apparatus according to claim 1, wherein the conveying surface of the conveying stage has a vacuum recess connected to the through hole, wherein the first surface of the conveying table has a vacuum groove communicating with the through hole and the vacuum recess, and wherein the vacuum recess is connected to a vacuum unit for receiving vacuum from the vacuum unit.

3. The workpiece conveying apparatus according to claim 1, wherein the exhaust hole has a main exhaust-hole section and said plurality of nozzle sections are each narrower than the main exhaust-hole section and connecting the main exhaust-hole section and the opening of the exhaust hole, and wherein a length of a compressed-gas flow path at the nozzle section is less than or equal to 60 percent of a square root of the area of an opening of the through hole proximate to the conveying surface.

4. The workpiece conveying apparatus according to claim 3, wherein the plurality of nozzle sections comprise first and second nozzle sections, each arranged for receiving a part of the workpiece positioned between the first and second nozzle sections.

5. The workpiece conveying apparatus according to claim 1, wherein the conveying table is disk-shaped having a central axis, wherein the first means drives and rotates the conveying table about the central axis, and wherein the rotation of the conveying table causes the through hole holding the workpiece to move in the circumferential direction of the conveying table.

6. The workpiece conveying apparatus according to claim 1, further comprising an electronic component conveyed in said through hole as said workpiece, said electronic component defining said end surface area.

* * * * *